US012666837B2

(12) United States Patent
Sun et al.

(10) Patent No.: US 12,666,837 B2
(45) Date of Patent: Jun. 23, 2026

(54) DISPLAY SCREEN AND ELECTRONIC DEVICE

(71) Applicant: GUANGDONG OPPO MOBILE TELECOMMUNICATIONS CORP., LTD., Dongguan (CN)

(72) Inventors: Zhou Sun, Dongguan (CN); Haiyu Zhang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 758 days.

(21) Appl. No.: 17/992,252

(22) Filed: Nov. 22, 2022

(65) Prior Publication Data

US 2023/0082133 A1 Mar. 16, 2023

Related U.S. Application Data

(63) Continuation of application No. PCT/CN2021/086659, filed on Apr. 12, 2021.

(30) Foreign Application Priority Data

May 22, 2020 (CN) .......................... 202010441938.2

(51) Int. Cl.
*H10K 59/121* (2023.01)
*H10K 59/35* (2023.01)
(52) U.S. Cl.
CPC .................................. *H10K 59/353* (2023.02)

(58) Field of Classification Search
CPC .... H10K 59/353; H10K 59/60; H10K 59/121; G09G 2320/0242; G09G 3/30; G09G 2300/0439; G09G 2320/0233; G09F 9/00
See application file for complete search history.

(56) References Cited

U.S. PATENT DOCUMENTS

2016/0284747 A1 9/2016 Park et al.
2020/0066809 A1 2/2020 Liu
(Continued)

FOREIGN PATENT DOCUMENTS

CN 107464831 A 12/2017
CN 107731870 A 2/2018
(Continued)

OTHER PUBLICATIONS

Chinese First office action with English Translation for CN Application No. 202010441938.2 mailed Aug. 4, 2021 (26 pages).
(Continued)

*Primary Examiner* — Jessica S Manno
*Assistant Examiner* — Bipana Adhikari Dawadi
(74) *Attorney, Agent, or Firm* — Young Basile Hanlon & MacFarlane, P.C.

(57) ABSTRACT

A display screen and an electronic device. The display screen comprises a first display region and a second display region connected to each other. The pixel density of the first display region is less than the pixel density of the second display region. Each of minimum repeat regions in the first display region comprises at least two pixel units, and each of the two pixel units comprises multiple pixels having different light-emitting colors. Pixel units in the same minimum repeat region are all located in the same diagonal direction of the minimum repeat region.

16 Claims, 13 Drawing Sheets

(56)                References Cited

U.S. PATENT DOCUMENTS

| | | | | | |
|---|---|---|---|---|---|
| 2020/0111401 | A1* | 4/2020 | Zhao | ..................... | G09G 3/2003 |
| 2020/0168674 | A1* | 5/2020 | Tan | ....................... | G02F 1/1333 |
| 2021/0065625 | A1* | 3/2021 | Wang | ................... | G09G 3/3233 |
| 2021/0335160 | A1* | 10/2021 | Li | ........................ | G09G 3/3258 |
| 2022/0059011 | A1* | 2/2022 | Li | ....................... | G07F 17/3267 |

FOREIGN PATENT DOCUMENTS

| | | | |
|---|---|---|---|
| CN | 108269840 | A | 7/2018 |
| CN | 108461521 | A | 8/2018 |
| CN | 109599053 | A | 4/2019 |
| CN | 109950288 | A | 6/2019 |
| CN | 109962092 | A | 7/2019 |
| CN | 209151258 | U | 7/2019 |
| CN | 110112189 | A | 8/2019 |
| CN | 110310576 | A | 10/2019 |
| CN | 110365819 | A | 10/2019 |
| CN | 110379836 | A | 10/2019 |
| CN | 110570774 | A | 12/2019 |
| CN | 110619813 | A | 12/2019 |
| CN | 110634910 | A | 12/2019 |
| CN | 110729332 | A | 1/2020 |
| CN | 110767099 | A | 2/2020 |
| CN | 111477103 | A | 7/2020 |
| EP | 3648088 | A1 | 5/2020 |
| JP | 2007102004 | A | 4/2007 |
| KR | 20180007822 | A | 1/2018 |
| WO | 2019242352 | A1 | 12/2019 |

OTHER PUBLICATIONS

Chinese Second office action with English Translation for CN Application No. 202010441938.2 mailed Feb. 18, 2022 (19 pages).

Chinese Third office action with English Translation for CN Application No. 202010441938.2 mailed Jun. 13, 2022 (20 pages).

Chinese Rejection decision with English Translation for CN Application No. 202010441938.2 mailed Nov. 2, 2022 (16 pages).

International Search Report and Written Opinion of the International Search with English Translation for PCT Application No. 202010441938.2 mailed Jul. 8, 2021 (10 pages).

Extended European Search Report for EP Application 21808916.7 mailed Sep. 29, 2023. (17 pages).

European Search Report, European Application No. 21808916.7, mailed Jan. 8, 2024 (16 pages).

Chinese Notification of Reexamination and English Translation, Chinese Application No. 202010441938.2, mailed Jan. 29, 2026 (24 pages).

Chinese Review Decision Letter and English Translation, Chinese Application No. 202010441938.2, mailed Mar. 31, 2026 (29 pages).

* cited by examiner

100

20    101    10

☒ pixel A having first color
⊞ pixel B having second color
▦ pixel C having third color

FIG. 1 (related art)

pixel A having first color pixel B having second color pixel C having third color pixel A having first color pixel B having second color pixel C having third color pixel A having first color pixel B having second color pixel C having third color pixel A having first color
pixel B having second color
pixel C having third color pixel A having first color pixel B having second color pixel C having third color

1110 pixel A having first color
pixel B having second color
pixel C having third color pixel A having first color pixel B having second color pixel C having third color pixel A having first color
pixel B having second color
pixel C having third color pixel A having first color pixel B having second color pixel C having third color brightness first display region     1     2     3          4     second display region 300     400

100

200

DISPLAY SCREEN AND ELECTRONIC DEVICE

CROSS-REFERENCE TO RELATED APPLICATION(S)

The present disclosure is a continuation of international (PCT) Patent Application No. PCT/CN2021/086659, filed on Apr. 12, 2021, which claims priority of Chinese Patent Application No. 202010441938.2, filed on May 22, 2020, the entire contents of both of which are hereby incorporated by reference.

TECHNICAL FIELD

The present disclosure relates to the field of display technologies, and in particular to a display screen and an electronic device.

BACKGROUND

In an electronic device, a display panel is an important component configured to achieve a display function. In order to increase a display region of the display panel to a maximum extent, a functional module may be arranged under the display panel. In addition, in order to ensure a complete display function of a display screen, pixels and lines may be arranged in a region of the display screen corresponding to the functional module.

SUMMARY

A display screen and an electronic device are provided in embodiments of the present disclosure.

A display screen is provided in some embodiments of the present disclosure and includes a first display region and a second display region. A pixel density of the first display region is less than a pixel density of the second display region. The first display region includes multiple minimum repeat regions, each of the multiple minimum repeat regions includes at least two pixel units, and each of the at least two pixel units includes multiple pixels having different light-emitting colors. The pixel units in a same minimum repeat region are all located in a same diagonal direction of the minimum repeat region.

An electronic device is provided in some embodiments of the present disclosure and includes a housing and the display screen, and the housing is assembled with the display screen. The display screen includes a first display region and a second display region. A pixel density of the first display region is less than a pixel density of the second display region. The first display region includes multiple minimum repeat regions, each of the multiple minimum repeat regions includes at least two pixel units, and each of the at least two pixel units includes multiple pixels having different light-emitting colors. The pixel units in a same minimum repeat region are all located in a same diagonal direction of the minimum repeat region.

BRIEF DESCRIPTION OF DRAWINGS

The foregoing and/or additional aspects and advantages of the present disclosure will become apparent and easily understood through descriptions of the embodiments in conjunction with the following accompanying drawings.

FIG. 1 is a schematic view of a display screen in the related art.

DETAILED DESCRIPTION

Embodiments of the present disclosure will be further described in the following in conjunction with accompanying drawings of the present disclosure. The same or similar numerals in the accompanying drawings indicate the same or similar components or components having the same or similar functions throughout.

Furthermore, the embodiments of the present disclosure described in the following in connection with the accompanying drawings are exemplary and are only configured to explain the embodiments of the present disclosure and can not to be construed as limitations for the present disclosure.

In the present disclosure, unless otherwise expressly specified and limited, a first feature being "on" or "under" a second feature may be the first feature being in a direct contact with the second feature, or the first feature being in an indirect contact with the second feature through an intermediate medium. In addition, the first feature being "on", "above", "over" the second feature may be the first feature being rightly above or diagonally above the second feature, or simply indicates that the first feature has a horizontal height greater than that of the second feature. The first feature being "below", "under", "underneath" the second feature may be the first feature being rightly under or diagonally under the second feature, or simply indicates that the first feature has the horizontal height less than that of the second feature.

With a continuous development of science and technology, more and more electronic devices having display functions are widely applied in daily life and work of people. The display panel is the important component of the electronic device configured to achieve the display function. Since people are constantly pursuing a large display screen, manufacturers of the electronic devices arrange various functional modules (such as cameras, structural light depth camera modules, time-of-flight depth camera modules, light sensors, color temperature sensors, proximity sensors, or flash) under the display screen to achieve a full screen, so as to increase a display area of the display screen to a maximum extent. However, when the functional modules send and receive signals, the signals are blocked by the pixels and the lines, which seriously affects normal operations of the functional modules arranged under the display screen.

Figure 2:
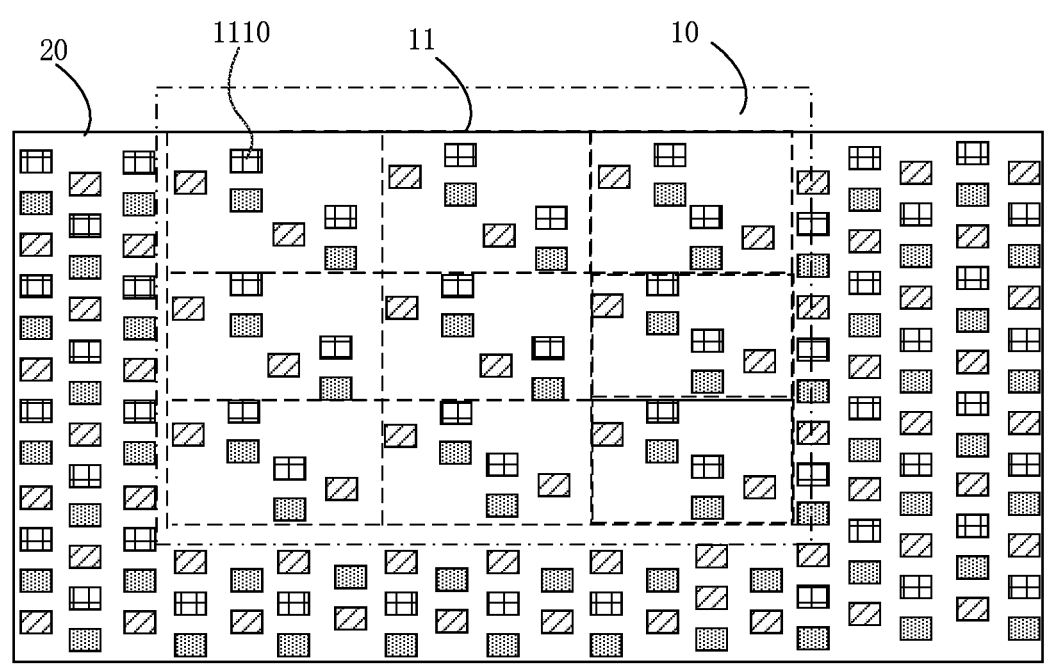
FIG. 2 is a schematic view of a display screen according to some embodiments of the present disclosure.
Figure 4:
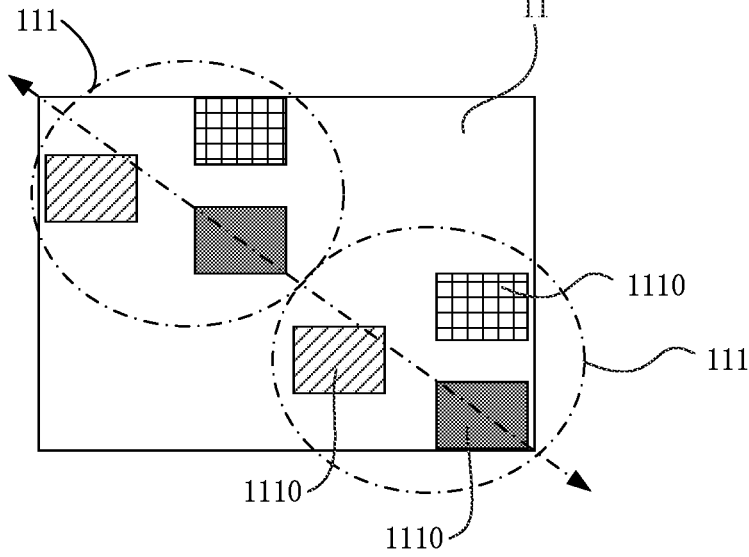
FIG. 4 is an enlarged schematic view of the minimum repeat region of the display screen in FIG. 2.

As shown in FIG. 2 and FIG. 4, a display screen 100 is provided in some embodiments of the present disclosure. The display screen 100 includes a first display region 10 and a second display region 20 connected to the first display region 10. A pixel density of the first display region 10 is less than a pixel density of the second display region 20. The first display region 10 includes multiple minimum repeat regions 11. Each of the plurality of minimum repeat regions 11 includes at least two pixel units 111. Each of the at least two pixel units 111 includes multiple pixels 1110 having different light-emitting colors, and the pixel units 111 in a same minimum repeat region 11 are all located in a same diagonal direction of the minimum repeat region 11.

In some embodiments, pixels 1110 having a same color emit lights simultaneously in the same minimum repeat region 11.

In some embodiments, the multiple minimum repeat regions 11 are arranged in an array. Each of the pixel units 111 includes a pixel A having a first color, a pixel B having a second color, and a pixel C having a third color, and the first color, the second color, and the third color are configured to synthetically display a white light.

Figure 5:
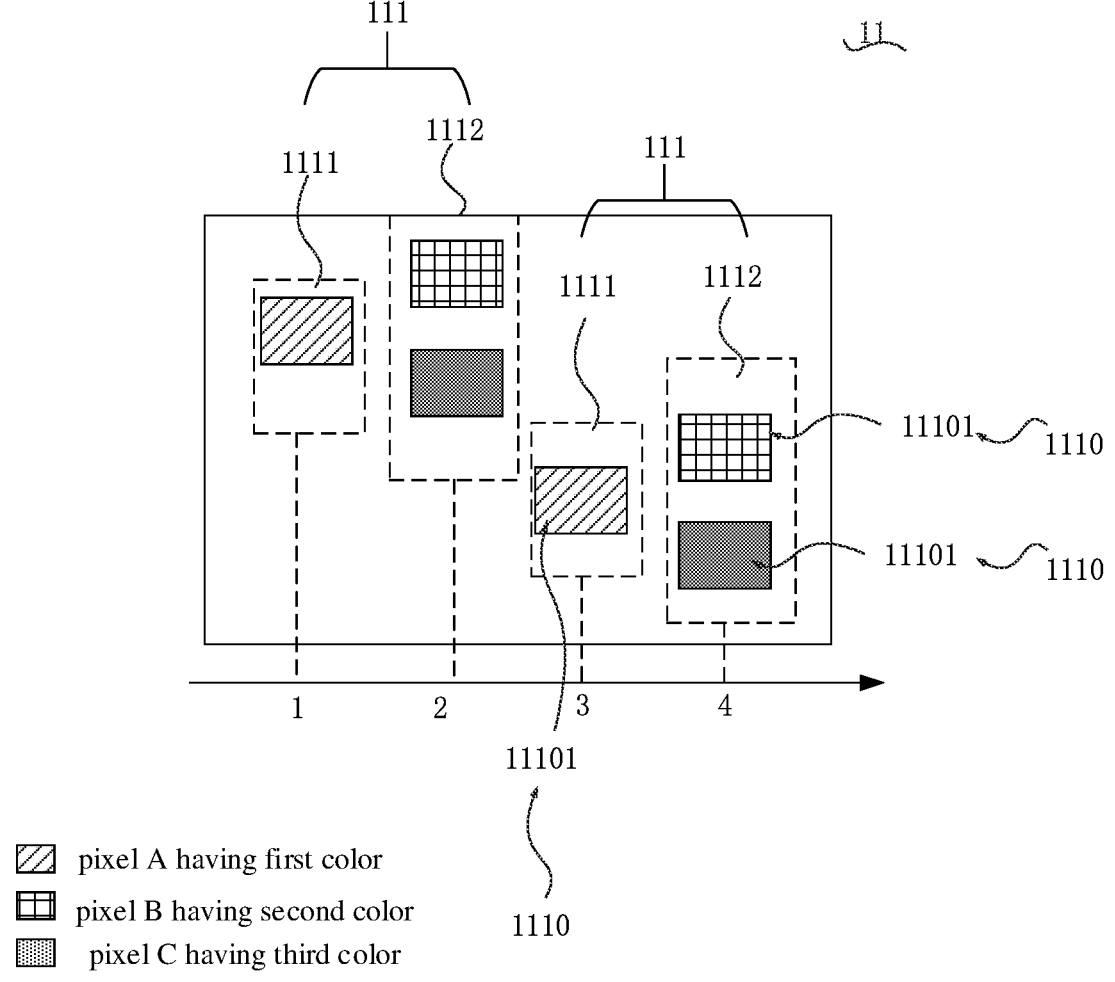
FIG. 5 is an enlarged schematic view of the minimum repeat region of the display screen according to some embodiments of the present disclosure.

As shown in FIG. 5, in some embodiments, each of the pixel units 111 includes a first sub-pixel unit 1111 and a second sub-pixel unit 1112, the first sub-pixel unit 111 is located in a first column, the second sub-pixel unit 1112 is located in a second column, and the first column is different from the second column.

As shown in FIG. 5, in some embodiments, the first sub-pixel unit 1111 includes the pixel A having the first color, the second sub-pixel unit 1112 includes the pixel B having the second color and the pixel C having the third color, and the pixel B having the second color and the pixel C having the third color are located in a same column.

Figure 6:
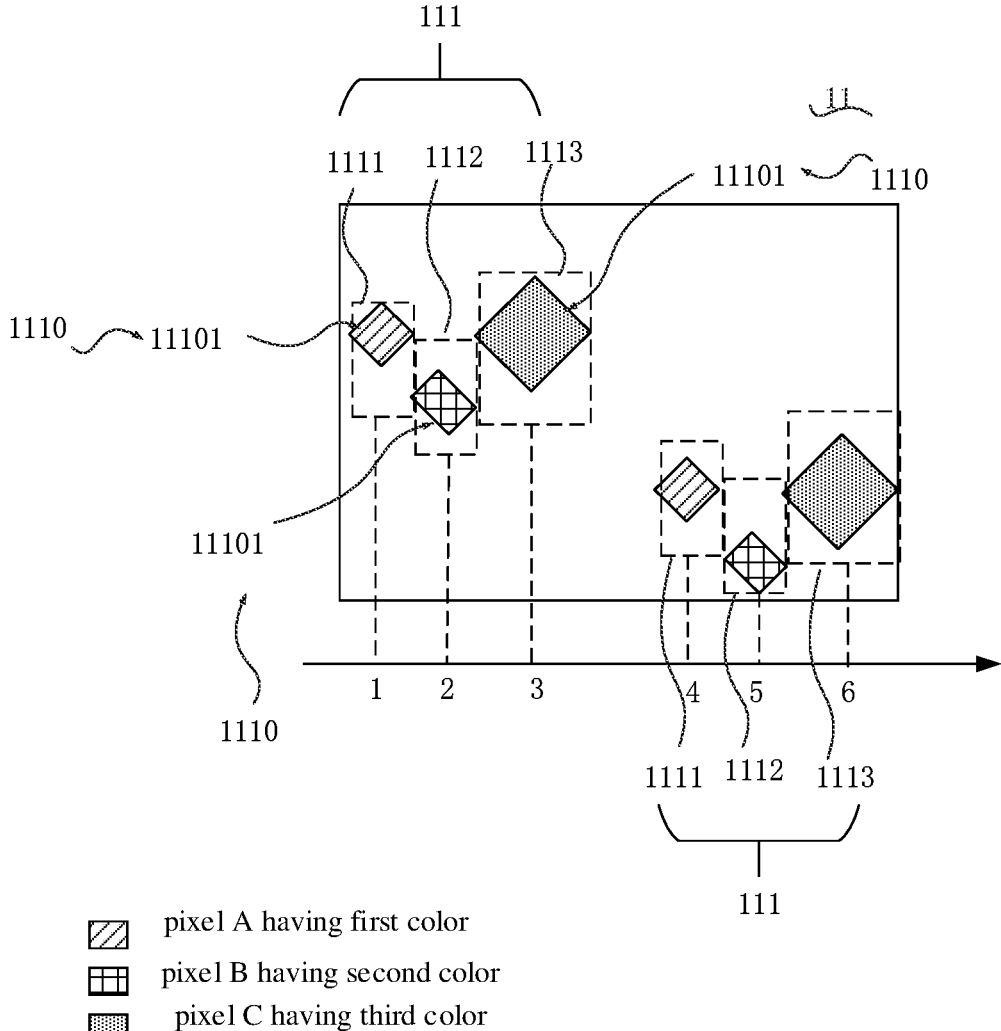
FIG. 6 is an enlarged schematic view of the minimum repeat region of the display screen according to some embodiments of the present disclosure.

As shown in FIG. 6, in some embodiments, each of the pixel units 111 includes a first sub-pixel unit 1111, a second sub-pixel unit 1112, and a third sub-pixel unit 1113. The first sub-pixel unit 1111 is located in a first column, the second sub-pixel unit 1112 is located in a second column, the third sub-pixel unit 1113 is located in a third column. The first column, the second column, and the third column are different from each other.

As shown in FIG. 6, in some embodiments, the first sub-pixel unit 1111 includes the pixel A having the first color, the second sub-pixel unit 1112 includes the pixel B having the second color, and the third sub-pixel unit 1113 includes the pixel C having the third color.

As shown in FIG. 5, in some embodiments, each of the multiple pixels 1110 includes a light-emitting window layer 11101, and light-emitting window layers 11101 of the pixels 1110 having different light-emitting colors have the same opening areas.

As shown in FIG. 6, in some embodiments, the light-emitting window layers 11101 of the pixels 1110 having the different light-emitting colors have different opening areas. A sum of an opening area of the light-emitting window layer 11101 of the pixel A having the first color and an opening area of the light-emitting window layer 11101 of the pixel C having the third color is twice of an opening area of the light-emitting window layer 11101 of the pixel B having the second color.

In some embodiments, the light-emitting window layers 11101 of all of the pixels 1110 are in a same plane.

In some embodiments, the first display region 10 is fully enclosed by the second display region 20; or the first display region 10 is semi-enclosed by the second display region 20.

Figure 7:
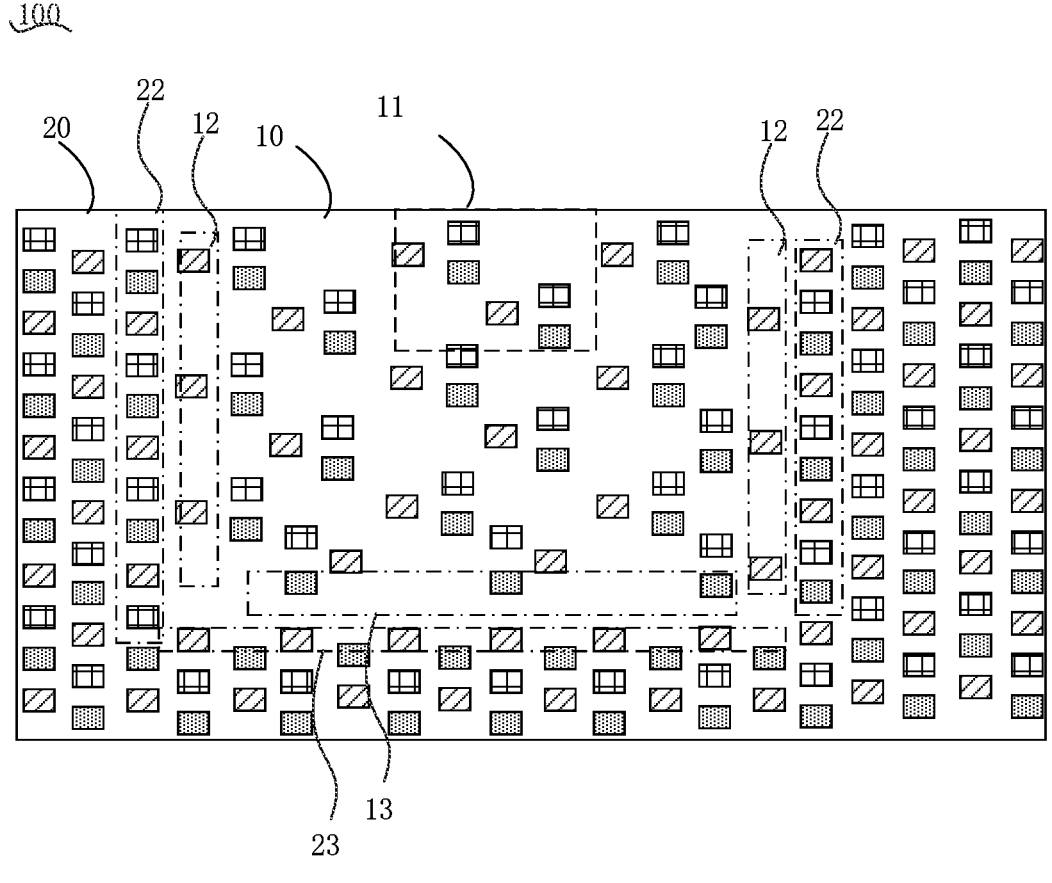
FIG. 7 is a schematic view of the display screen according to some embodiments of the present disclosure.

As shown in FIG. 7, in some embodiments, the first display region 10 includes at least one first adjacent row 13 adjacent to the second display region 20, and at least one first adjacent column 12 adjacent to the second display region 20. The second display region 20 includes at least one second adjacent row 23 adjacent to the first display region 10, and at least one second adjacent column 22 adjacent to the first display region 10. The at least one second adjacent row 23 corresponds to the at least one first adjacent row 13, and the at least one second adjacent column 22 corresponds to the at least one first adjacent column 12. A color of a pixel 1110 in each first adjacent row 13 is different from a color of an opposite pixel 1110 in a corresponding second adjacent row 23; and/or a color of a pixel 1110 in each first adjacent column 12 is different from a color of an opposite pixel 1110 in the corresponding second adjacent column 22.

Figure 8:
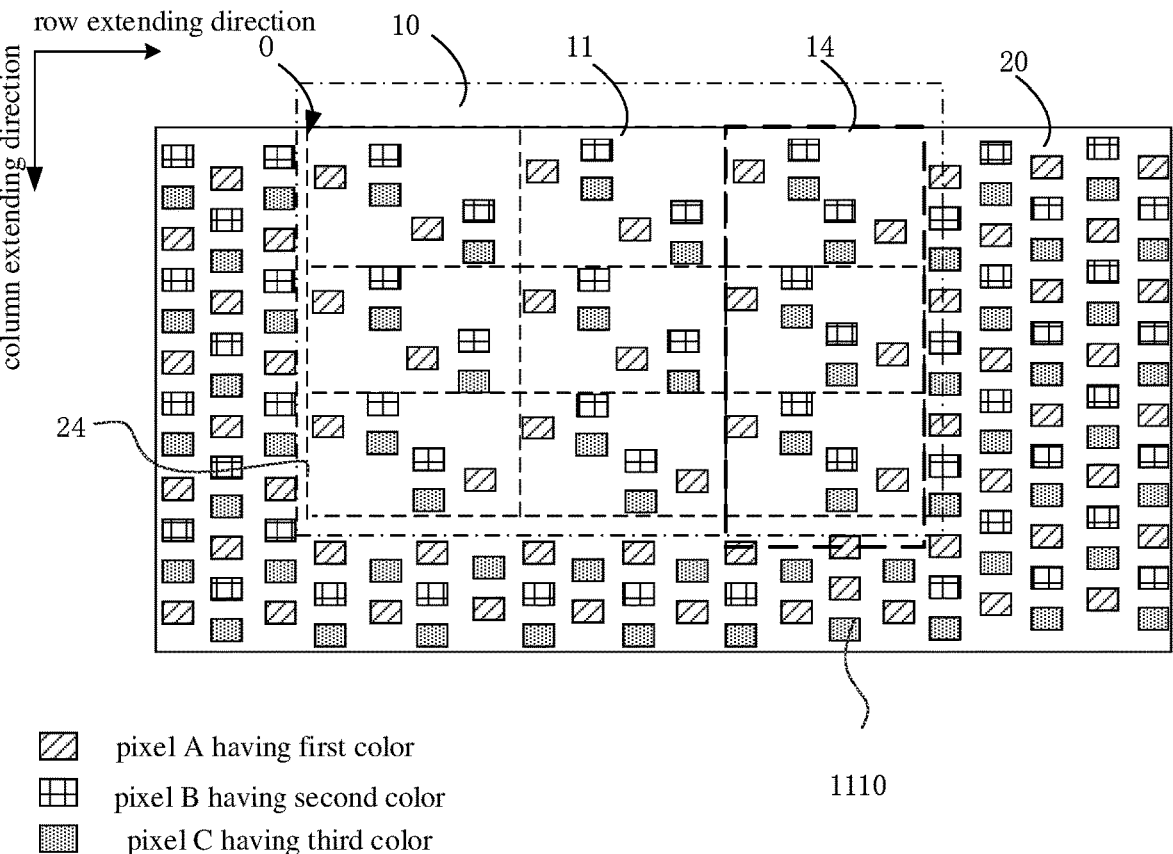
FIG. 8 is a schematic view of the display screen according to some embodiments of the present disclosure.

As shown in FIG. 8, in some embodiments, the array extends along a row direction and extends along a column direction. The at least two pixel units 111 in the minimum repeat region 11 have different arrangements in a terminating column 14; and/or the at least two pixel units 111 in the minimum repeat region 11 have different arrangements in a terminating row 24.

In some embodiments, adjacent sub-pixel units of the at least two pixel units 111 are the same in the same minimum repeat region 11 in the termination row 24; and/or adjacent sub-pixel units of the at least two pixel units 111 are the same in the same minimum repeat region 11 in the termination column 14.

Figure 10:
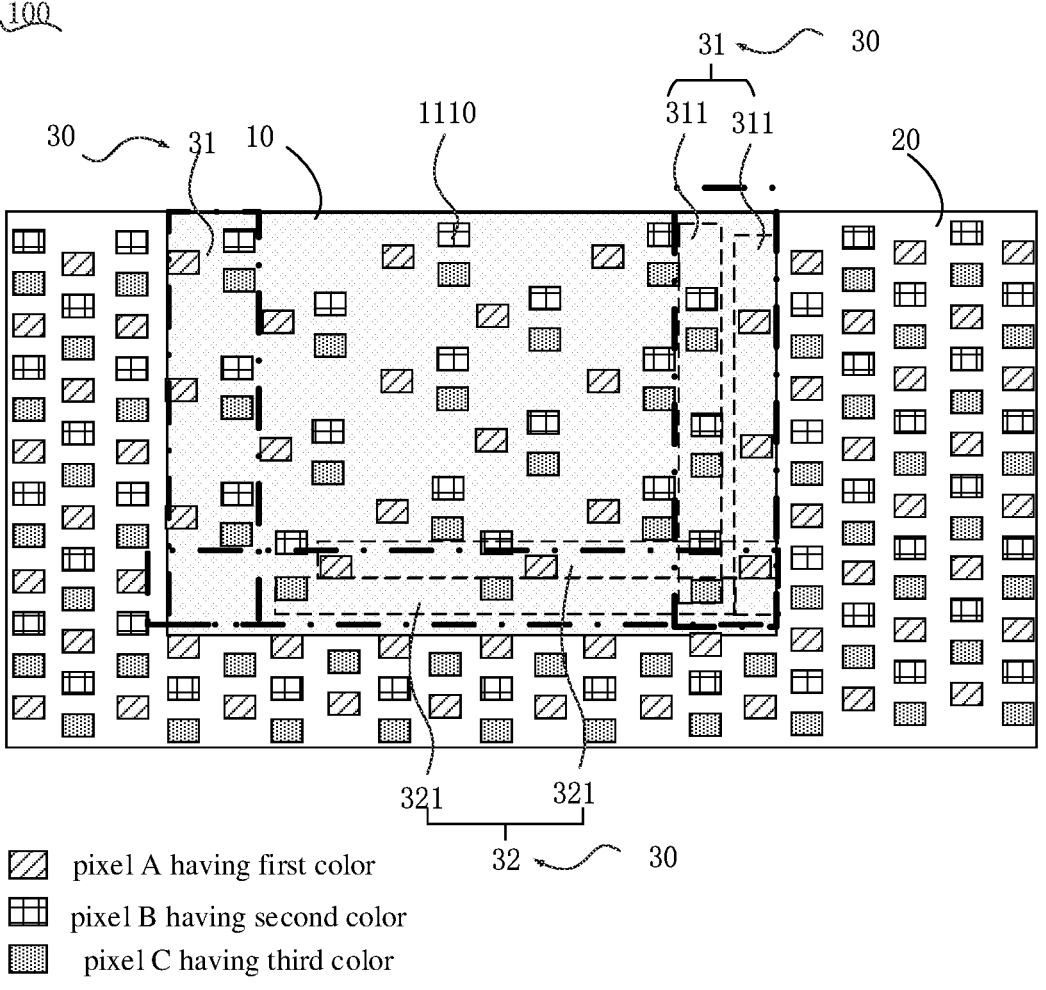
FIG. 10 is a schematic view of the display screen according to some embodiments of the present disclosure.
Figure 11:
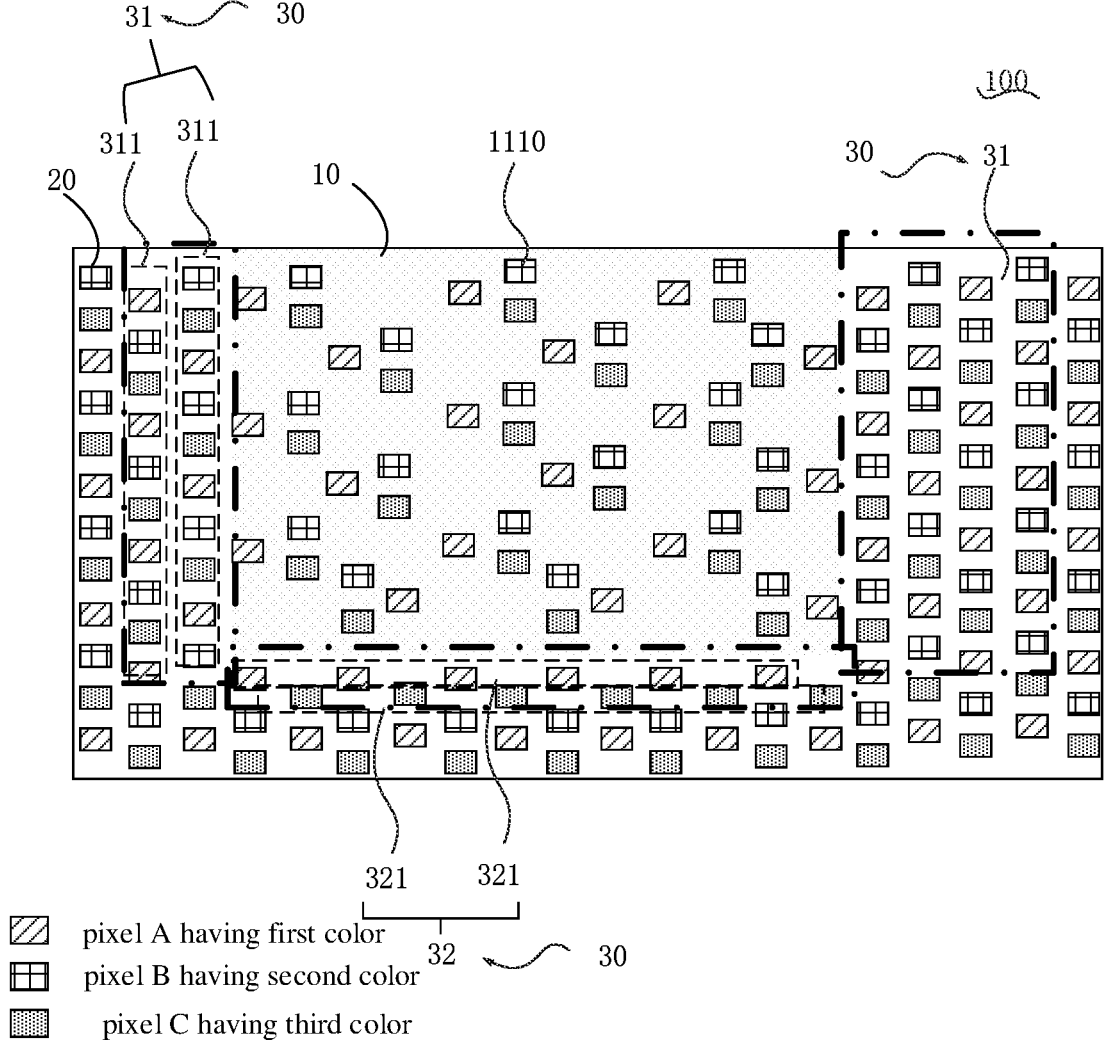
FIG. 11 is a schematic view of the display screen according to some embodiments of the present disclosure.
Figure 12:
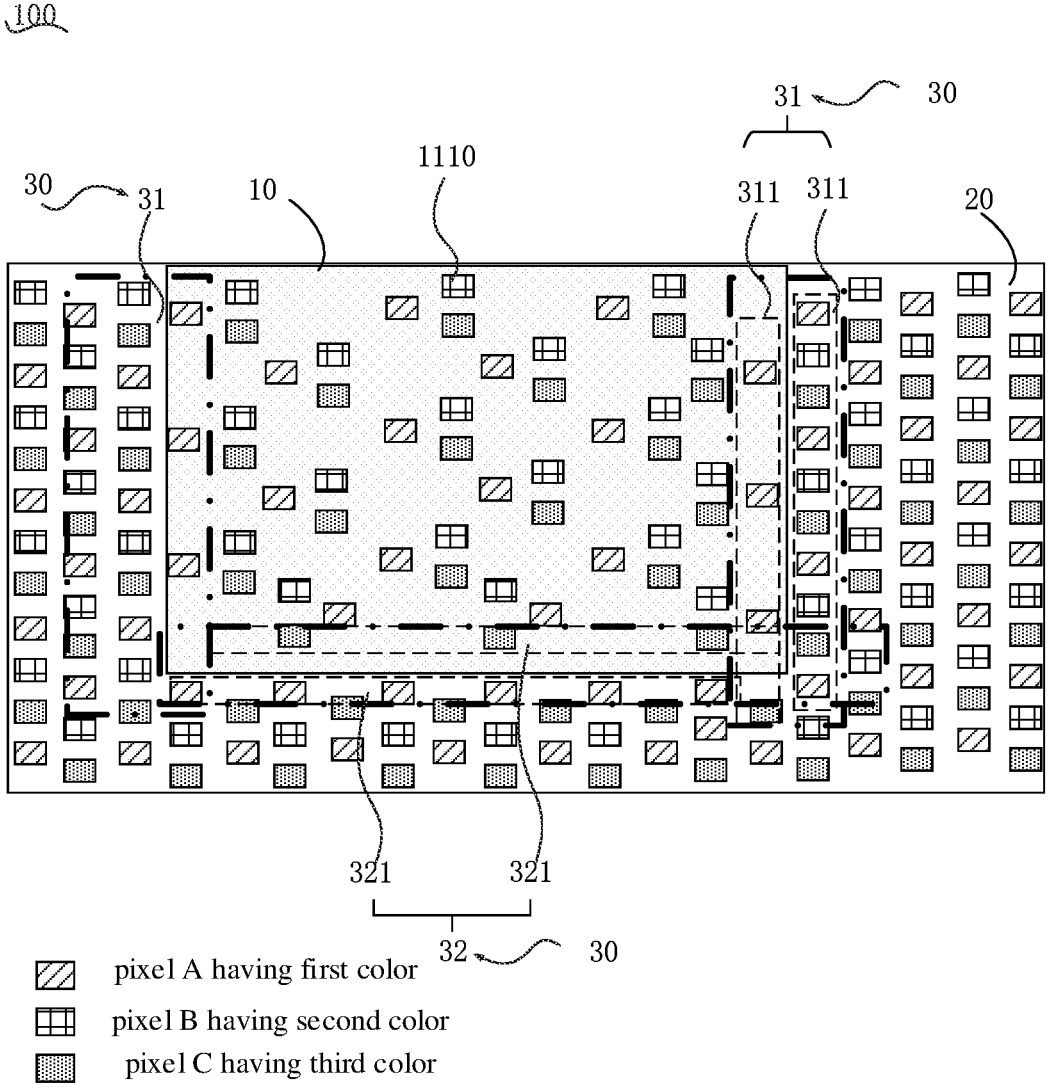
FIG. 12 is a schematic view of the display screen according to some embodiments of the present disclosure.
Figure 13:
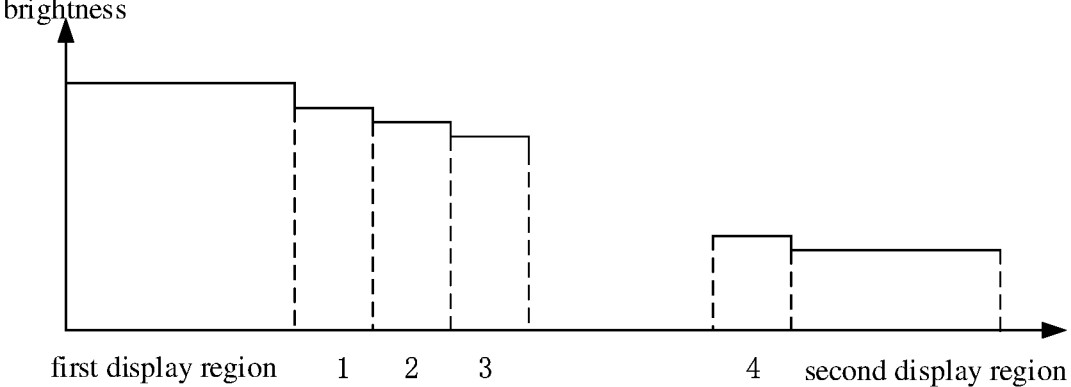
FIG. 13 is a schematic diagram of a trend of a change of brightness of the transition region of the display according to some embodiments of the present disclosure.

As shown in FIGS. 10 to 12, in some embodiments, at least one of the first display region 10 and the second display region 20 includes a transition region 30. The first display region 10 has a first brightness, the second display region 20 has a second brightness, and the second brightness is less than the first brightness. A brightness of the transition region 30 gradually decreases in a direction from the first display region 10 to the second display region 20.

In some embodiments, brightness of pixels 1110 in adjacent rows or brightness of pixels 1110 in adjacent columns of the transition region 30 is in an arithmetic progression or in a geometric sequence.

As shown in FIGS. 10 to 13, in some embodiments, the transition region 30 includes a column transition region 31 formed by the first display region 10 and the second display region 20 extending in a column direction and a row transition region 32 formed by the first display region 10 and the second display region 20 extending in a row direction. Brightness of pixels of each column in the column transition region 31 is related to the first brightness, the second brightness, a width of the column transition region 31, and a position of a current column in the column transition region 31; and/or brightness of pixels of each row in the row transition region 32 is related to the first brightness, the second brightness, a width of the row transition region 32, and a position of the current row in the row transition region 32.

In some embodiments, pixels 1110 having a same color in the same minimum repeat region 11 are controlled by a same circuit; or light-emitting window layers 11101 of the pixels 1110 having the same color are connected in the same minimum repeat region 11.

Figure 14:
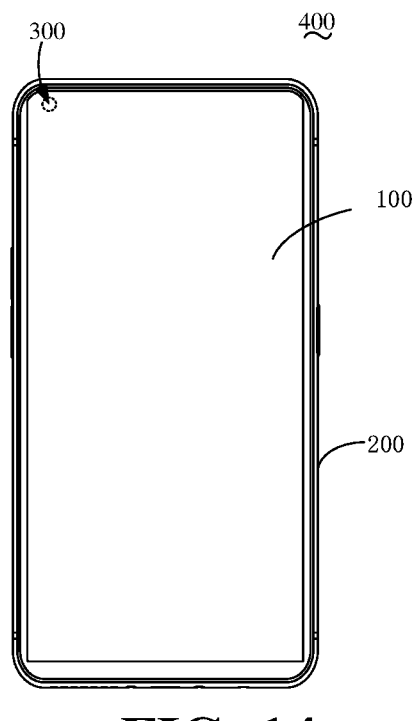
FIG. 14 is a structural schematic view of an electronic device according to some embodiments of the present disclosure.

As shown in FIG. 14, an electronic device 400 is provided in the present disclosure. The electronic device 400 includes a housing 200 and a display screen 100 as described in any of the above embodiments. The display screen 100 is assembled with the housing 200.

In some embodiments, the electronic device 400 further includes at least one functional module 300. The functional module 300 is arranged in an accommodating space 203 defined by the housing 200 and the display screen 100. The functional module 300 corresponds to the first display region 10.

In some embodiments, the functional module 300 may include at least one of a camera, a structural light depth camera module, a time-of-flight depth camera module, a light sensor, a color temperature sensor, a proximity sensor, or a flash light.

In the present disclosure, the pixel density of the first display region 10 of the display screen 100 is less than the pixel density of the second display region 20 of the display screen 100. In addition, the pixel units 111 in the same minimum repeat region 11 of the first display region 10 are all located in the same diagonal direction of the minimum repeat region 11, and no pixel is arranged in another diagonal direction of the minimum repeat region 11. In this way, while the display screen 100 is capable of displaying normally, a light-transmitting area of the first display region 10 may be increased significantly, such that a signal amount received and transmitted by the functional module 300 (as shown in FIG. 14) arranged under the first display region 10, facilitating a normal operation of the functional module 300.

Generally, in order to avoid a signal being blocked by the pixels and the lines, the pixel density of the first display region 10 is less than the pixel density of the second display region 20. That is, the number of the pixels 1110 in the first display region 10 is less than the number of the pixels 1110 in the second display region 20 per unit area, such that the light-transmitting area of the first display region 10 may be greater than a light-transmitting area of the second display region 20. Although such a design may facilitate the normal operation of the functional module 300 under the display screen 100, a brightness of the first display region 10 is less than a brightness of the second display region 20 due to the number of the pixels in the first display region 10 being less than the number of the pixels in the second display region 20, which may affect a display effect of the display screen 100. In the related art, the brightness of the first display region 10 may be the same with the brightness of the second display region 20 by increasing brightness of the pixels in the first display region 10. Since the brightness of the pixels in the first display region 10 is greater than brightness of the pixels in the second display region 20, a serve life of the 10 may be reduced more quickly than a serve life of the second display region 20. That is, a problem that different regions of the display screen 100 may have different decay speeds may be caused, affecting a display consistency of the display screen 100.

Figure 1:
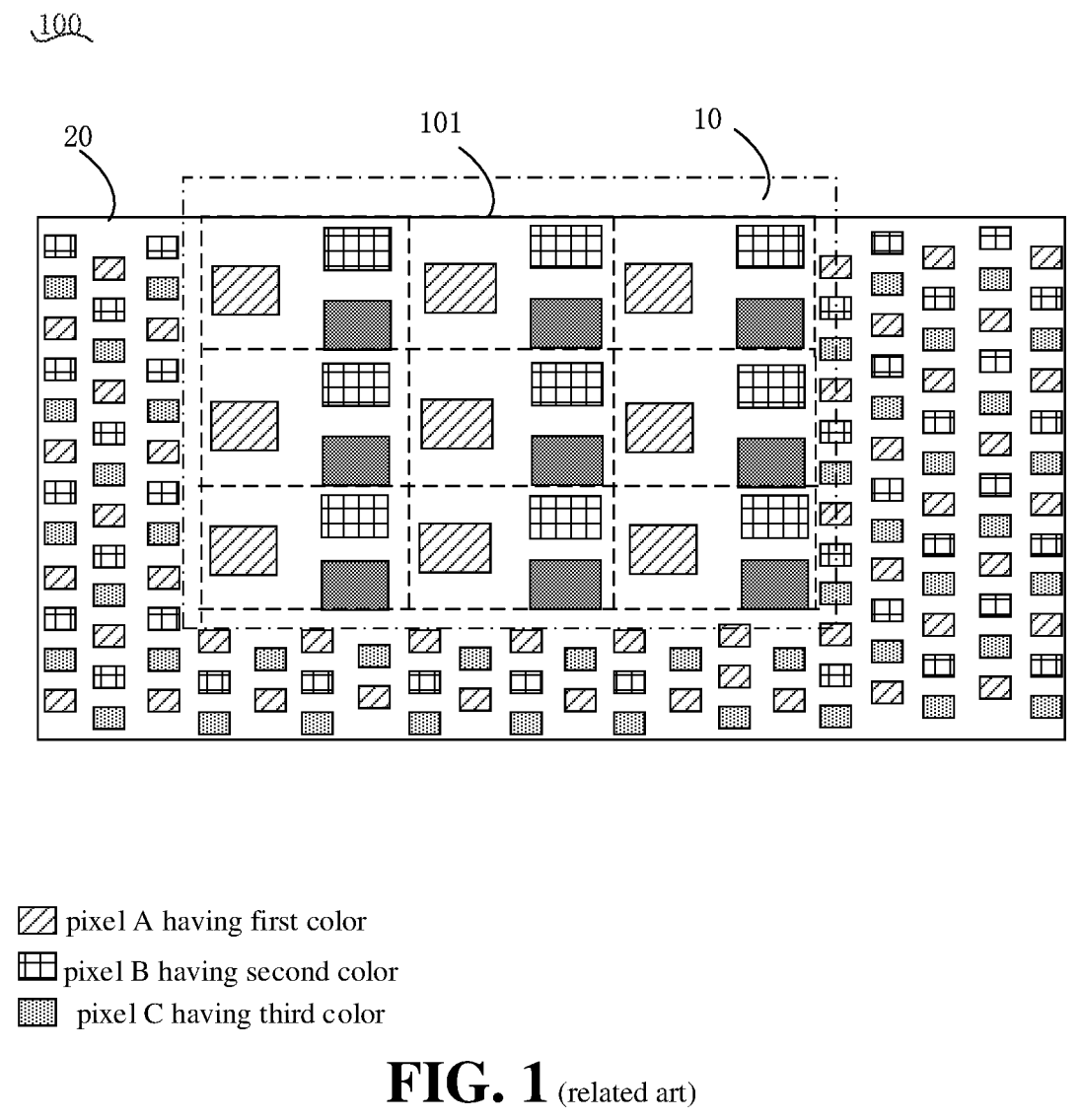
Figure 3:
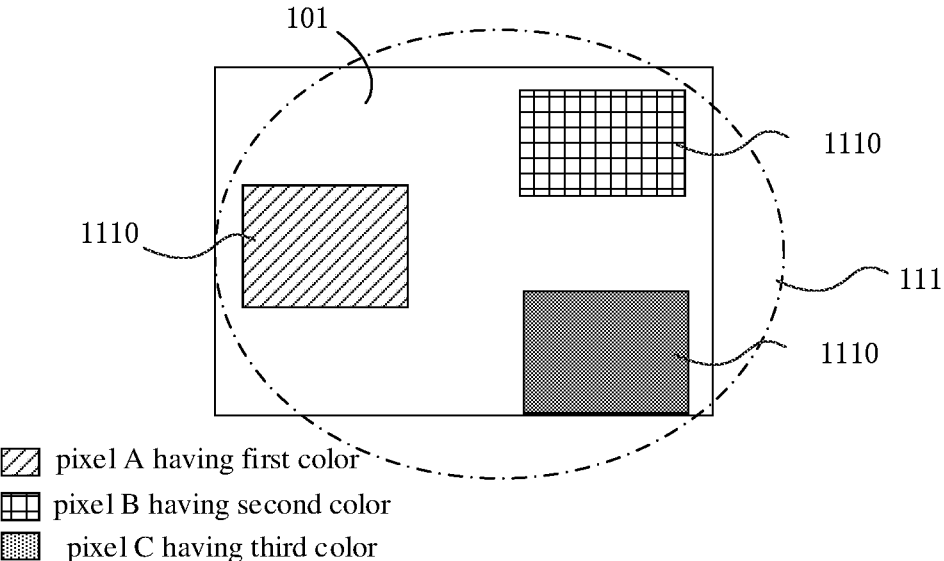
FIG. 3 is an enlarged schematic view of the minimum repeat region of the display screen in FIG. 1.

In order to solve the above problems, while the pixel density of the first display region 10 is usually configured to be less than the pixel density of the second display region 20, areas of the pixels 1110 in the first display region 10 is also increased, so as to increase an overall brightness of the first display region 10. In this way, the brightness of the first display region 10 may be the same with the brightness of the second display region 20. Specifically, as shown in FIGS. 1 and 3, the display screen 100 includes the first display region 10 and the second display region 20. The first display region 10 includes multiple minimum repeat regions 101. Each of the multiple minimum repeat regions 101 includes a pixel unit 111. Each pixel unit 111 includes multiple pixels 1110 having different light-emitting colors. An area of a pixel 1110 of the first display region 10 is greater than an area of a pixel 1110 of the second display region 20, such that a total area of the pixels 1110 is balanced with a total area of the light-transmitting region (i.e., a region of the first display region 10 without the pixel 1110) in the first display region 10. In this way, a size of the light-transmitting region of the first display region 10 may ensure the normal operation of the functional module 300 under the display screen 100. In addition, the brightness of the first display region 10 may be the same with the brightness of the second display region 20, such that a possibility of the different regions of the display screen 100 having different decay speeds may be reduced. However, when the first display region 10 is configured with a structure as shown in FIG. 1, since a difference between the area of a single pixel 1110 in the first display region 10 and the area of a single pixel 1110 in the second display region 20 is greater, and spacing between multiple pixels 1110 in the first display region 10 is greater, the display effect may be greatly reduced due to a graininess sense of the display screen 100 being enhanced in a macroscopic perception of a human eye.

Since the display screen 100 in the embodiments of the present disclosure includes the minimum repeat region 11 (as shown in FIG. 2) having the same area with a minimum repeat region 101 (as shown in FIG. 1) in the related art, and the minimum repeat region 11 is configured with at least two pixel units 111 arranged in the diagonal direction of the minimum repeat region 11, a problem of the display screen 100 having the graininess sense may be resolved. Specifically, as shown in FIG. 3 and FIG. 4, the minimum repeat region 101 in FIG. 3 is located in the first display region 10 shown in FIG. 1, and the minimum repeat region 11 in FIG. 4 is located in the first display region 10 shown in FIG. 2 of the present disclosure. The minimum repeat region 101 has the same area with the minimum repeat region 11, the minimum repeat region 101 only includes one pixel unit 111, and the minimum repeat region 11 includes the at least two pixel units 111 (taking the minimum repeat region 11 including two pixel units 111 as an example for a convenience of descriptions). In can be understood that in the minimum repeat region having the same area, the greater the number of the pixel units 111 is, the less the spacing between two adjacent pixel units 111. That is, compared to including the minimum repeat region 101 as shown in FIG. 1, the first display region 10 may have a less spacing when the first display region 10 including the minimum repeat region 11 in the embodiments of the present disclosure, such that spacing between the pixels 1110 may be less. Therefore, when the display screen adopts the minimum repeat region 11 in the embodiments of the present disclosure, both a problem of the pixels and the lines blocking and a problem of displaying inconsistently may be resolved, and a possibility of the display screen 100 having the graininess sense may be reduced, so as to improve the display effect of the display screen 100.

In some embodiments, the pixels 1110 having the same color in the same minimum repeat region 11 emit the lights simultaneously, so as to achieve an effect of the pixels 1110 having the same color of the minimum repeat region 101 in the related art emitting the lights separately. Specifically, as shown in FIG. 3 and FIG. 4, the minimum repeat region 101 in FIG. 3 is located in the first display region 10 shown in FIG. 1, and the minimum repeat region 11 in FIG. 4 is located in the first display region 10 shown in FIG. 2 of the present disclosure. The minimum repeat region 101 has the same area with the minimum repeat region 11, the minimum repeat region 101 only includes one pixel unit 111, and the minimum repeat region 11 includes the at least two pixel units 111 (taking the minimum repeat region 11 including two pixel units 111 as an example for the convenience of descriptions). Each of the pixel units 111 includes the pixel A having the first color, the pixel B having the second color, and the pixel C having the third color. That is, the number of the pixels 1110 having the same color of the minimum repeat region 101 is less than the number of the pixels 1110 having the same color in the same minimum repeat region 11. In can be understood that, in order to achieve a same light-emitting effect (the light-emitting effect including a light-emitting brightness and a light-emitting color), the less the number of the pixels 1110 having the same color in the same minimum repeat region 11 is, the greater a light-emitting brightness of each of the pixels 1110 required is. In the embodiments, the pixels 1110 having the same color and less brightness in the same minimum repeat region 11 are configured to emit the lights simultaneously, to replace the pixels 1110 having the same color and greater brightness of the minimum repeat region 101 in the related art emitting the lights separately. In this way, the same light-emitting effect may be achieved while the brightness of the pixels 1110 in the first display region 10 is reduced, which increase the serve life of the display screen 100.

In some embodiments, the total area of all pixels 1110 in the minimum repeat region 11 in FIG. 4 may be equal to the total area of all pixels 1110 in the minimum repeat region 101 in FIG. 3. Since an area of the minimum repeat region 11 is equal to an area of the minimum repeat region 101, and the total area of all pixels 1110 in the minimum repeat region 11 is equal to the total area of all pixels 1110 in the minimum repeat region 101, the total area of the light-transmitting region in the minimum repeat region 11 is equal to a total area of the light-transmitting region in the minimum repeat region 101. Since the total area of the pixels 1110 in the first display region 10 and the total area of the light-transmitting region may remain balanced as shown in FIG. 1, the size of the light-transmitting region of the first display region 10 may be ensured to meet a requirement of the normal operation of the functional module 300 under the display screen 100. In addition, the brightness of the first display region 10 may be the same with the brightness of the second display area 20, such that a problem of the different regions of the display screen 100 having different decay speeds may be reduced. Furthermore, since the area of the single pixel 1110 in the first display region 10 is reduced relative to the area of the single pixel 1110 in the first display region 10 shown in FIG. 1, and the spacing between the pixels 1110 in the first display region 10 is also reduced relative to the spacing between the pixels 1110 in the first display region 10 shown in FIG. 1, a possibility of the display screen 100 having a greater graininess sense may be reduced, so as to improve the display effect pf the display screen 100.

The first display region 10 may be connected to the second display region 20 in various ways. In an embodiment, the first display region 10 is fully enclosed by the second display region 20. That is, the first display region 10 is surrounded by the second display region 20 on all sides. In another embodiment, the first display region 10 is semi-enclosed by the second display region 20. That is, the first display region 10 is surrounded by the second display region 20 on at least two sides. For example, the first display region 10 is located at a top of an electronic device 400 (as shown in FIG. 14), similar to a bangs region. In a further example, only one side of the first display region 10 is connected to the second display region 20. A side edge of the first display region 10 which does not abut against with the second display region 20 may be a pixel vacant region (a region with no pixels arranged) of the display screen 100, or a region beyond the display screen 100, without limitations herein.

The first display region 10 being semi-enclosed by the second display region 20 and the first display region 10 being located at the top of the electronic device 400 (as shown in FIG. 14) is taken as an example and further described in the following, and all structures in other connected ways may refer to this example and be not described in detail.

As shown in FIG. 2, the display screen 100 includes the first display region 10 and a second display region 20 connected to the first display region 10. The pixel density of the first display region 10 is less than the pixel density of the second display region 20. Since the pixel density of the first display region 10 is less than the pixel density of the second display region 20, the area of the light-transmitting region of the first display region 10 is increased, which facilitates an external signal to enter the functional module 300 (shown in FIG. 14) arranged under the first display region 10 through the light-transmitting region.

As shown in FIG. 2 and FIG. 4, the first display region 10 includes multiple minimum repeat regions 11, and the multiple minimum repeat regions 11 are arranged in the array. Each of the multiple minimum repeat regions 11 includes at least two pixel units 111. Since all the pixel units 111 in the same minimum repeat region 11 are all located in the same diagonal direction of the minimum repeat region 11, compared to a case where all the pixel units 111 are all located in a same row or a same column of the minimum repeat region 11, the first display region 10 may display more evenly, and the display effect of the display screen 100 may be improved.

It should be noted that the number of the pixel units 111 in each of the minimum repeat regions 11 may be 2, 3, 4 or more. All embodiments of the present disclosure are described with an example of the number of the pixel units 111 in the minimum repeat region 11 being 2.

Each of the pixel units 111 includes the multiple pixels 1110 having different light-emitting colors, specifically as shown in FIG. 4. Each of the pixel units 111 includes the pixel A having the first color, the pixel B having the second color, and the pixel C having the third color. The first color, the second color, and the third color are configured to synthetically display the white light. It should be noted that the pixel A having the first color, the pixel B having the second color, and the pixel C having the third color may be combined into any color by adjusting a different ratio configuration. In this case, the pixel A having the first color is any of a blue pixel, a red pixel, or a green pixel; the pixel B having the second color is any of the blue pixel, the red pixel, the green pixel; the pixel C having the third color is any of the blue pixel, the red pixel, the green pixel; as long as a condition that the first color of the pixel A having the first color, the second color of the pixel B having the second color, and the third color of the pixel C having the third color may synthetically display the white light is satisfied. In this embodiment, the pixel A having the first color is the blue pixel, the pixel B having the second color is the green pixel, and the pixel C having the third color is the red pixel. In another embodiment, the pixel A having the first color is the red pixel, the pixel B having the second color is the green pixel, and the pixel C having the third color is the blue pixel. In a further embodiment, the pixel A having the first color is the red pixel, the pixel B having the second color is the blue pixel, and the pixel C having the third color is the green pixel. The pixel A having the first color, the pixel B having the second color, and the pixel C having the third color may be a combination of pixels having other colors, which are not listed herein.

As shown in FIG. 5, in some embodiments, each of the pixel units 111 includes the first sub-pixel unit 1111 and the second sub-pixel unit 1112. The first sub-pixel unit 1111 is located in a first column, the second sub-pixel unit 1112 is located in a second column, and the first column is different from the second column. Each of the minimum repeat region 11 includes two pixel units 111, and each of the two pixel units 111 includes the first sub-pixel unit 1111 and the second sub-pixel unit 1112. That is, each of the minimum repeat region 11 includes two first sub-pixel units 1111 and two second sub-pixel units 1112. One of the two first sub-pixel units 1111 is located in the first column of the minimum repeat region 1, and the other one of the two first sub-pixel units 1111 is located in the third column of the minimum repeat region 11. One of the two second sub-pixel units 1112 is located in the second column of the minimum repeat region 1, and the other one of the two second sub-pixel units 1112 is located in the fourth column of the minimum repeat region 11. In the minimum repeat region 11, both the first sub-pixel unit 1111 located in the first column and the second sub-pixel unit 1112 located in the second column are in the same pixel unit 111, and both the first sub-pixel unit 1111 located in the third column and the second sub-pixel unit 1112 located in the fourth column are in the same pixel unit 111.

The pixels 1110 in the display screen 100 in the embodiments of the present disclosure may be arranged in a way of a delta arrangement. Specifically, as shown in FIG. 5, in some embodiments, the first sub-pixel unit 1111 includes the pixel A having the first color, the second sub-pixel unit 1112 includes the pixel B having the second color and the pixel C having the third color, and the pixel B having the second color and the pixel C having the third color are located in the same column. The pixel A having the first color is located in the first column of the minimum repeat region 11 and the third column of the minimum repeat region 11. One pixel B having the second color and one pixel C having the third color are located in the second column of the minimum repeat region 11, and another pixel B having the second color and another pixel C having the third color are located in the fourth column of the minimum repeat region 11. The pixel A having the first color in the first column, and the pixel B having the second color and the pixel C having the third color in the second column are in the same pixel unit 111. The pixel A having the first color in the third column, and the pixel B having the second color and the pixel C having the third color in the fourth column are in the same pixel unit 111.

As shown in FIG. 6, in some embodiments, each of the pixel units 111 includes the first sub-pixel unit 1111, the second sub-pixel unit 1112, and a third sub-pixel unit 1113. The first sub-pixel unit 1111, the second sub-pixel unit 1112, and the third sub-pixel unit 1113 are located in different columns. That is, the first sub-pixel unit 1111 is located in a first column, the second sub-pixel unit 1112 is located in a second column, the third sub-pixel unit 1113 is located in a third column, and the first column, the second column, and the third column are different from each other. Specifically, each of the minimum repeat region 11 includes two pixel units 111, and each of the two pixel units 111 includes the first sub-pixel unit 1111, the second sub-pixel unit 1112, and the third sub-pixel unit 1113. That is, each of the minimum repeat region 11 includes two first sub-pixel units 1111, two second sub-pixel units 1112, and two third sub-pixel units 1113. One of the two first sub-pixel units 1111 is located in the first column of the minimum repeat region 1, and the other one of the two first sub-pixel units 1111 is located in the fourth column of the minimum repeat region 11. One of the two second sub-pixel units 1112 is located in the second column of the minimum repeat region 1, and the other one of the two second sub-pixel units 1112 is located in the fifth column of the minimum repeat region 11. One of the two third sub-pixel units 1113 is located in the third column of the minimum repeat region 1, and the other one of the two third sub-pixel units 1113 is located in the sixth column of the minimum repeat region 11.

The pixels 1110 in the display screen 100 in the embodiments of the present disclosure may be arranged in a way of a pentile arrangement. Specifically, as shown in FIG. 6, in some embodiments, the first sub-pixel unit 1111 includes the pixel A having the first color, the second sub-pixel unit 1112 includes the pixel B having the second color, and the third sub-pixel unit 1113 includes the pixel C having the third color. One pixel A having the first color is located in the first column of the minimum repeat region 11, and another pixel A having the first color is located in the fourth column of the minimum repeat region 11. One pixel B having the second color is located in the second column of the minimum repeat region 11, and another pixel B having the second color is located in the fifth column of the minimum repeat region 11. One pixel C having the third color is located in the third column of the minimum repeat region 11, and another pixel C having the third color is located in the sixth column of the minimum repeat region 11. The pixel A having the first color in the first column, and the pixel B having the second color in the second column, and the pixel C having the third color in the third column are in the same pixel unit 111. The pixel A having the first color in the fourth column, the pixel B having the second color in the fifth column, and the pixel C having the third color in the sixth column are in the same pixel unit 111.

As shown in FIG. 5 and FIG. 6, each of the pixels 1110 includes the light-emitting window layer 11101. The light-emitting window layers 11101 of all of the pixels 1110 are in the same plane. A driving circuit (not shown) drives the light emitted by the pixels 1110 to reach an outside through the light-emitting window layers 11101 to achieve the display function of the display screen 100.

In some embodiments, the light-emitting window layers 11101 of the pixels 1110 having different light-emitting colors have the same opening areas. Specifically, as shown in FIG. 5, the pixel unit 111 includes the pixel A having the first color, the pixel B having the second color, and the pixel C having the third color. An opening area of the light-emitting window layers 11101 of the A having the first color, an opening area of the light-emitting window layers 11101 of the pixel B having the second color, and an opening area of the light-emitting window layers 11101 of the pixel C having the third color are the same. Since the light-emitting window layers 11101 of the pixels 1110 having different light-emitting colors have the same opening areas, it may be more difficult to have an edge scarp in a process of manufacturing the pixels 1110, and the process may be simpler.

In some embodiments, the light-emitting window layers 11101 of the pixels 1110 having the different light-emitting colors have different opening areas. Specifically, as shown in FIG. 6, the pixel unit 111 includes the pixel A having the first color, the pixel B having the second color, and the pixel C having the third color. The opening area of the light-emitting window layers 11101 of the A having the first color, the opening area of the light-emitting window layers 11101 of the pixel B having the second color, and the opening area of the light-emitting window layers 11101 of the pixel C having the third color are different. In the same pixel unit 111, a sum of the opening area of the light-emitting window layer 11101 of the pixel A having the first color and the opening area of the light-emitting window layer 11101 of the pixel C having the third color is twice of the opening area of the light-emitting window layer 11101 of the pixel B having the second color. That is, the sum of the opening area of the light-emitting window layer 11101 of the blue pixel A and the opening area of the light-emitting window layer 11101 of the red pixel C is equal to twice of the opening area corresponding to the light-emitting window layer 11101 of the green pixel B. In this way, each pixel point in the display screen 100 may form three base colors with another color of an adjacent pixel point of this pixel point, such that the number of the pixels may be reduced, and a high resolution may be simulated by a low resolution. In addition, a visual brightness at the same brightness may be greater.

In some embodiments, the pixels 1110 having the same color in the same minimum repeat region 11 are controlled by the same circuit (not shown), such that the pixels 1110 having the same color in the same minimum repeat region 11 may emit the lights simultaneously. In another embodiment, the light-emitting window layers 11101 of the pixels 1110 having the same color are connected in the same minimum repeat region 11, such that the pixels 1110 having the same color in the same minimum repeat region 11 may also emit the lights simultaneously. Since the minimum repeat region 11 includes at least two pixel units 111, all the pixel units 111 in the same minimum repeat region 11 are located in the same diagonal direction of the minimum repeat region 11, and no pixel is arranged in another diagonal direction of the minimum repeat region 11. The pixels 1110 having the same color may emit the lights simultaneously. In this way, while the display screen 100 is capable of displaying normally, the light-transmitting area of the first display region 10 may be increased significantly, such that the signal amount received and transmitted by the functional module 300 (as shown in FIG. 14) arranged under the first display region 10, facilitating the normal operation of the functional module 300. Furthermore, the problem of the graininess sense caused by the pixel density of the first display region 10 being less may be improved, which improves the display effect of the display screen 100.

As shown in FIG. 7, the first display region 10 includes at least one first adjacent column 12 adjacent to the second display region 20, the second display region 20 includes at least one second adjacent column 22 adjacent to the first display region 10. The first adjacent column 12 is closer to the second display region 20 than other columns of the first display region 10. The second adjacent column 22 is closer to the first display region 10 than other columns of the second display region 20. For the connected way between the first display region 10 and the second display region 20 as shown in FIG. 7, the number of first adjacent columns 12 is two, one of the two first adjacent columns 12 is arranged at a left side of the first display region 10, and the other one of the two first adjacent columns 12 is arranged at a right side of the first display region 10. The number of second adjacent columns 22 is also two, one of the two second adjacent columns 22 is arranged at a left side of the second display region 20, and the other one of the two second adjacent columns 22 is arranged at a right side of the second display region 20.

In some embodiments, a color of each pixel in the first adjacent column 12 is different from a color of an opposite pixel (rightly opposite in a row extending direction) in the second adjacent column 22 corresponding to the first adjacent column 12. For example, the pixels 1110 in the first adjacent column 12 in the right side are all the pixels A having the first color, while in the row extending direction, the pixels 1110 in the second adjacent column 22 in the right side opposite to the pixels A having the first color are the pixels B having the second color and the pixels C having the third color. In this way, a possibility of a color edge caused by the pixels 1110 having one or two same colors aggregating existing at a connection position between the first display region 10 and the second display region 20 may be reduced, which may ensure the display effect of the display screen 100.

As shown in FIG. 7, the first display region 10 includes at least one first adjacent row 13 adjacent to the second display region 20, the second display region 20 includes at least one second adjacent row 23 adjacent to the first display region 10. The first adjacent row 13 is closer to the second display region 20 than other rows of the first display region 10. The second adjacent row 23 is closer to the first display region 10 than other rows of the second display region 20. For the connected way between the first display region 10 and the second display region 20 as shown in FIG. 7, the number of the first adjacent row 13 is one, the first adjacent row 13 is arranged at a middle side of the first display region 10. The number of the second adjacent row 23 is also one, the second adjacent row 23 is arranged at a top side of the second display region 20. When the first display region 10 is fully enclosed by the second display region 20, the number of first adjacent rows 13 is two, one of the two first adjacent rows 13 is arranged at an upper side of the first display region 10, and the other one of the two first adjacent rows 13 is arranged at a lower side of the first display region 10. The number of second adjacent rows 23 is also two, one of the two second adjacent rows 23 is arranged at the upper side of the second display region 20, and the other one of the two second adjacent rows 23 is arranged at a lower side of the second display region 20.

In some embodiments, the color of the pixel in each first adjacent row 13 is different from the color of the opposite pixel (rightly opposite in a column extending direction) in the second adjacent row 23 corresponding to the first adjacent row 13. For example, the pixels 1110 in the first adjacent row 13 in the lower side are all the pixels C having the third color, while in the column extending direction, the pixels 1110 in the second adjacent row 23 in the middle side opposite to the pixels C having the third color are the pixels A having the first color. In this way, the possibility of the color edge caused by the pixels 1110 having one or two same colors aggregating existing at the connection position between the first display region 10 and the second display region 20 may be reduced, which may ensure the display effect of the display screen 100.

Figure 9:
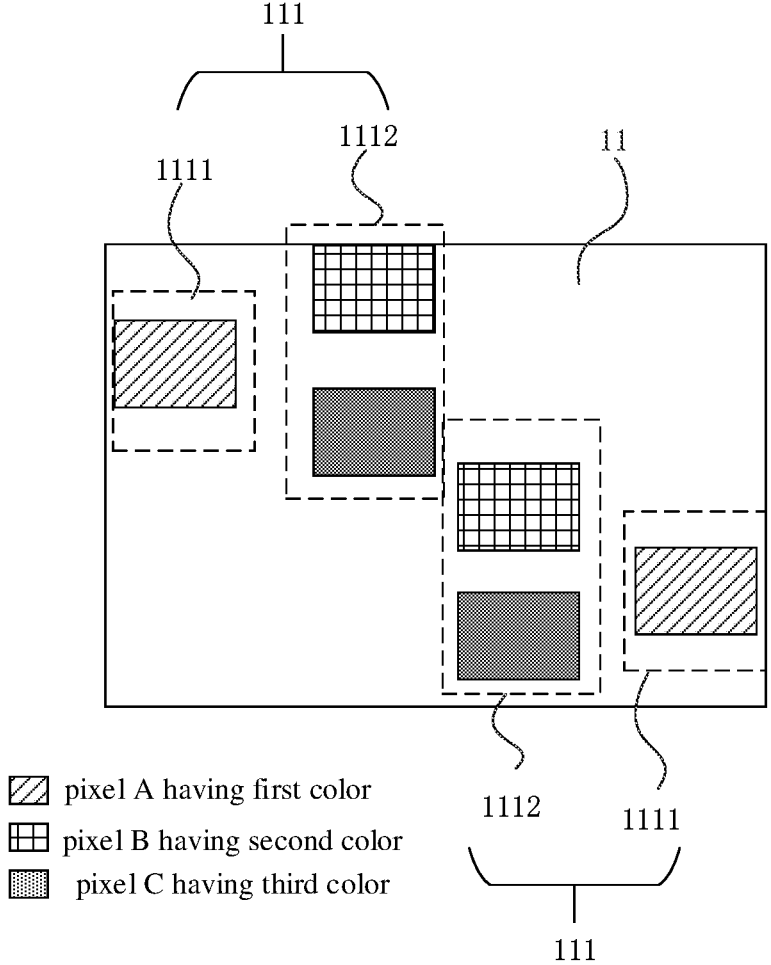
FIG. 9 is an enlarged schematic view of a part of the minimum repeat region of the display screen in FIG. 8.

As shown in FIG. 8, in the first display region 10, the minimum repeat region 11 extends from a starting extension position O long the row direction and extends along the column direction. In some embodiments, the at least two pixel units 111 in the minimum repeat region 11 have different arrangements in the terminating column 14. For example, the first display region 10 in FIG. 8 includes three columns of the minimum repeat region 11, and the terminating column 14 is a column farthest from the starting extension position O of the minimum repeat region 11. The two pixel units 111 in the minimum repeat region 11 have different arrangements in the terminating column 14. The adjacent sub-pixel units of the at least two pixel units 111 are the same in the same minimum repeat region 11 in the termination column 14. As shown in FIG. 9, in the termination column 14, the minimum repeat region 11 includes two pixel units 111. Each of the two pixel units 111 includes the first sub-pixel unit 1111 and the second sub-pixel unit 1112, and the second sub-pixel unit 1112 of each of the two pixel units 111 is closer to another one of the two pixel units 111 than the first sub-pixel unit 1111 in the same pixel units 111 with the second sub-pixel unit 1112. That is, the adjacent sub-pixel units between the two pixel units 111 are both the second sub-pixel unit 1112. In this way, the possibility of the color edge caused by the pixels 1110 having one or two same colors aggregating existing at the connection position between the first display region 10 and the second display region 20 may be reduced, which may ensure the display effect of the display screen 100.

As shown in FIG. 8, in some embodiments, the at least two pixel units 111 in the minimum repeat region 11 have different arrangements in the terminating row 24. For example, the first display region 10 in FIG. 8 includes three rows of the minimum repeat region 11, and the terminating row 24 is a row farthest from the starting extension position O of the minimum repeat region 11. The two pixel units 111 in the minimum repeat region 11 have different arrangements in the terminating row 24. The adjacent sub-pixel units of the at least two pixel units 111 are the same in the same minimum repeat region 11 in the termination row 24. Specifically, as shown in FIG. 9, in the termination row 24, the minimum repeat region 11 includes two pixel units 111. Each of the two pixel units 111 includes the first sub-pixel unit 1111 and the second sub-pixel unit 1112, and the second sub-pixel unit 1112 of each of the two pixel units 111 is closer to another one of the two pixel units 111 than the first sub-pixel unit 1111 in the same pixel units 111 with the second sub-pixel unit 1112. That is, the adjacent sub-pixel units between the two pixel units 111 are both the second sub-pixel unit 1112. In this way, the possibility of the color edge caused by the pixels 1110 having one or two same colors aggregating existing at the connection position between the first display region 10 and the second display region 20 may be reduced, which may ensure the display effect of the display screen 100.

As shown in FIG. 2, the pixel density of the first display region 10 is less than the pixel density of the second display area 20, and the area of the light-transmitting region of the first display region 10 is greater than the area of the light-transmitting region of the second display region 20. Since when the display screen 100 displays a picture, only a region arranged with the pixel 1110 may emit the light, and the light-transmitting region does not emit the light. When the brightness of the pixels 1110 of the first display region 10 is the same with the brightness of the pixels 1110 of the second display region 20, the whole first display region 10 is darker than the whole second display region 20, resulting in inconsistent display brightness of the display screen 100, which brings an uncomfortable experience to a user. In order to solve the problem, the brightness of each of the pixels 1110 in the first display region 10 may be increased. Since the pixels at the connection position between the first display region 10 and the second display region 20 have different brightness, resulting a bright edge macroscopically existing between the first display region 10 and the second display region 20, which may cause a deterioration of the display effect.

To solve the above problem, as shown in FIGS. 10 to 12, in some embodiments, at least one of the first display region 10 and the second display region 20 includes a transition region 30. For example, as shown in FIG. 10, only the first display region 10 includes the transition region 30, that is, the transition region 30 is only located in the first display region 10. Alternatively, as shown in FIG. 11, only the second display region 20 includes the transition region 30, that is, the transition region 30 is only located in the second display region 20. Alternatively, as shown in FIG. 12, both the first display region 10 and the second display region 20 include the transition region 30. That is, a part of the transition region 30 is located in the first display region 10, the other part of the transition region 30 is located in the second display region 20. No limitation is made herein. The first display region 10 has the first brightness, the second display region 20 has the second brightness, and the second brightness is less than the first brightness. The brightness of the transition region 30 gradually decreases in the direction from the first display region 10 to the second display region 20. Specifically, the closer to the first display region 10 the pixel 1110 in the transition region 30 is, the greater the brightness of the pixel 1110 is. The closer the pixel 1110 in the transition region 30 to the second display region 20, the less the brightness of the pixel 1110. Since the brightness of the transition region 30 gradually decreases in the direction from the first display region 10 to the second display region 20, the bright edge of the picture may be effectively eliminated, which may improve the display effect.

Specifically, as shown in FIGS. 10 to 13, the transition region 30 includes the column transition region 31 formed by the first display region 10 and the second display region 20 extending in the column direction and the row transition region 32 formed by the first display region 10 and the second display region 20 extending in the row direction. The column transition region 31 includes at least one transition column 311, and the row transition region 32 includes at least one transition row 321. The brightness of the pixels 1110 in two adjacent transition columns 311 in the same column transition region 31 is in the arithmetic progression. For example, when the brightness of the first display region 10 is 100, the brightness of the second display region 20 is 80, and the column transition region 31 includes three transition columns 311, the three transition columns 311 may be 95, 90, 85. Of course, the brightness of the pixels 1110 in two adjacent transition columns 311 in the same column transition region 31 may also be in the geometric sequence. No limitation is made herein, as long as all brightness of the transition columns 311 in the same column transition region 31 is less than the brightness of the first display region 10 and greater than the brightness of the second display region 20; the closer to the first display region 10 the transition column 311 is, the greater the brightness of the transition column 311 is; and the closer to the second display region 20 the transition column 311 is, the less the brightness of the transition column 311 is. Similarly, the brightness of the pixels 1110 in two adjacent transition rows 321 in the same column transition region 31 is in the arithmetic progression or in the geometric sequence, which is not repeated herein.

As shown in FIGS. 10 to 12, in some embodiments, the brightness of the pixels of each column in the column transition region 31 is related to the first brightness of the first display region 10, the second brightness of the second display region 20, the width of the column transition region 31, and the position of the current column in the column transition region 31. That is, in the same column transition region 31, the brightness of each of the transition columns 311 is related to the first brightness of the first display region 10, the second brightness of the second display region 20, the width of the column transition region 31, and the position of this transition column 311 in the column transition region 31. Specifically, the brightness of the pixels in each column in the column transition region 31 satisfies the following formula:

$$L_i = L_{10} - \frac{L_{10} - L_{20}}{W}$$

In the above formula, $L_i$ is the brightness of the pixels in the $i^{th}$ column in the column transition region 31, $L_{10}$ is the first brightness of the first display region 10, $L_{20}$ is the second brightness of the second display region 20, W is the width of the column transition region 31, i is the position of the current column in the column transition region 31, i.e., a column number of the current column in the column transition region 31. W=n+1, and n is a total number of the columns in the column transition region 31.

For example, the first brightness $L_{10}$ of the first display region 10 is 100, the second brightness $L_{20}$ of the second display region 20 is 50, a width of the transition region 30 (i.e. the width of the column transition region 31) is 5, that is, a total number n of the columns in the transition region 30 (i.e., the total number of the columns in the column transition region 31) is 4. i corresponding to the four transition columns 311 may respectively be set to be 1, 2, 3, 4 in a direction from the first display region 10 to the second display region 20. The brightness of the transition column 311 in the $1^{st}$ column is $$L_1 = 100 - \frac{100 - 50}{5} * 1 = 90,$$

the brightness of the transition column 311 in the $2^{nd}$ column is $$L_2 = 100 - \frac{100 - 50}{5} * 2 = 80,$$

the brightness of the transition column 311 in the $3^{rd}$ column is $$L_3 = 100 - \frac{100 - 50}{5} * 3 = 70,$$

the brightness of the transition column 311 in the $4^{th}$ column is $$L_4 = 10 - \frac{100 - 50}{5} * 4 = 60.$$

Since the brightness of the column transition region 31 decreases gradually in the direction from the first display region 10 to the second display region 20, the bright edge of the picture may be effectively eliminated, which may improve the display effect.

Similarly, the brightness of the pixels of each row in the row transition region 32 is related to the first brightness of the first display region 10, the second brightness of the second display region 20, the width of the row transition region 32, and the position of the current row in the row transition region 32. That is, in the same row transition region 32, the brightness of each of the transition rows 321 in the same row transition region 32 is related to the first brightness of the first display region 10, the second brightness of the second display region 20, the width of the row transition region 32, and the position of this transition row 321 in the row transition region 32. Specifically, the brightness of the pixels in each row of the row transition region 32 satisfies the following formula:

$$L_k = L_{10} - \frac{L_{10} - L_{20}}{M} * k$$

In the above formula, $L_k$ is the brightness of the pixels in the $k^{th}$ row in the row transition region 32, $L_{10}$ is the first brightness of the first display region 10, $L_{20}$ is the second brightness of the second display region 20, M is the width of the row transition region 32, k is the position of the current row in the row transition region 32, that is, a row number of the current row in the row transition region 32. M=m+1, and m is a total number of the rows in the row transition region 32. Since the brightness of the row transition region 32 decreases gradually in the direction from the first display region 10 to the second display region 20, the bright edge of the picture may be effectively eliminated, which may improve the display effect.

In summary, since the multiple minimum repeat regions 11 includes at least two pixel units 111, the pixel units 111 in the same minimum repeat region 11 are all located in the same diagonal direction of the minimum repeat region 11, and the pixels having the same color emit the lights simultaneously, the display screen 100 is capable of displaying normally while the light-transmitting area of the first display region 10 is increased significantly, such that the signal amount received and transmitted by the functional module 300 (as shown in FIG. 14) arranged under the first display region 10, facilitating the normal operation of the functional module 300. Furthermore, the problem of the graininess sense caused by the pixel density of the first display region 10 being less may be effectively improved, which improves the display effect of the display screen 100.

In addition, the color of the pixel in each first adjacent column 12 is different from the color of the opposite pixel (rightly opposite in the column extending direction) in the second adjacent column 22 corresponding to the first adjacent column 12, and the color of the pixel in each first adjacent row 13 is different from the color of the opposite pixel (rightly opposite in the row extending direction) in the second adjacent row 23 corresponding to the first adjacent row 13. Alternatively, the adjacent sub-pixel units of the at least two pixel units 111 are the same in the same minimum repeat region 11 in the termination column 14, and the adjacent sub-pixel units of the at least two pixel units 111 are the same in the same minimum repeat region 11 in the termination row 24. In this way, the possibility of the color edge color edge caused by the pixels 1110 having one or two same colors aggregating existing at the connection position between the first display region 10 and the second display region 20 may be reduced, which may ensure the display effect of the display screen 100.

Since the brightness of the transition region 30 decreases gradually in the direction from the first display region 10 to the second display region 20, the bright edge of the picture may be effectively eliminated, which may improve the display effect of the display screen 100.

As shown in FIG. 14, an electronic device 400 is provided in some embodiments of the present disclosure. The electronic device 400 may be a mobile phone, a tablet computer, a laptop computer, such as a smart watch, a smart bracelet, a virtual reality device, or the like, without limitations herein. The electronic device 400 includes a housing 200 and a display screen 100 as described in any of the above embodiments, and the display screen 100 is assembled with the housing 200.

According to the electronic device 400 in the embodiments of the present disclosure, the pixel density of the first display region 10 is less than the pixel density of the second display region 20, all the pixel units 111 in the multiple minimum repeat regions 11 in the first display region 10 are located in the same diagonal directions of the minimum repeat regions, and no pixel is arranged in the other diagonal direction of each of the minimum repeat regions. In this way, the display screen 100 is capable of displaying normally while the light-transmitting area of the first display region 10 is increased significantly, such that the signal amount received and transmitted by the functional module 300 (as shown in FIG. 14) arranged under the first display region 10, facilitating the normal operation of the functional module 300.

Figure 15:
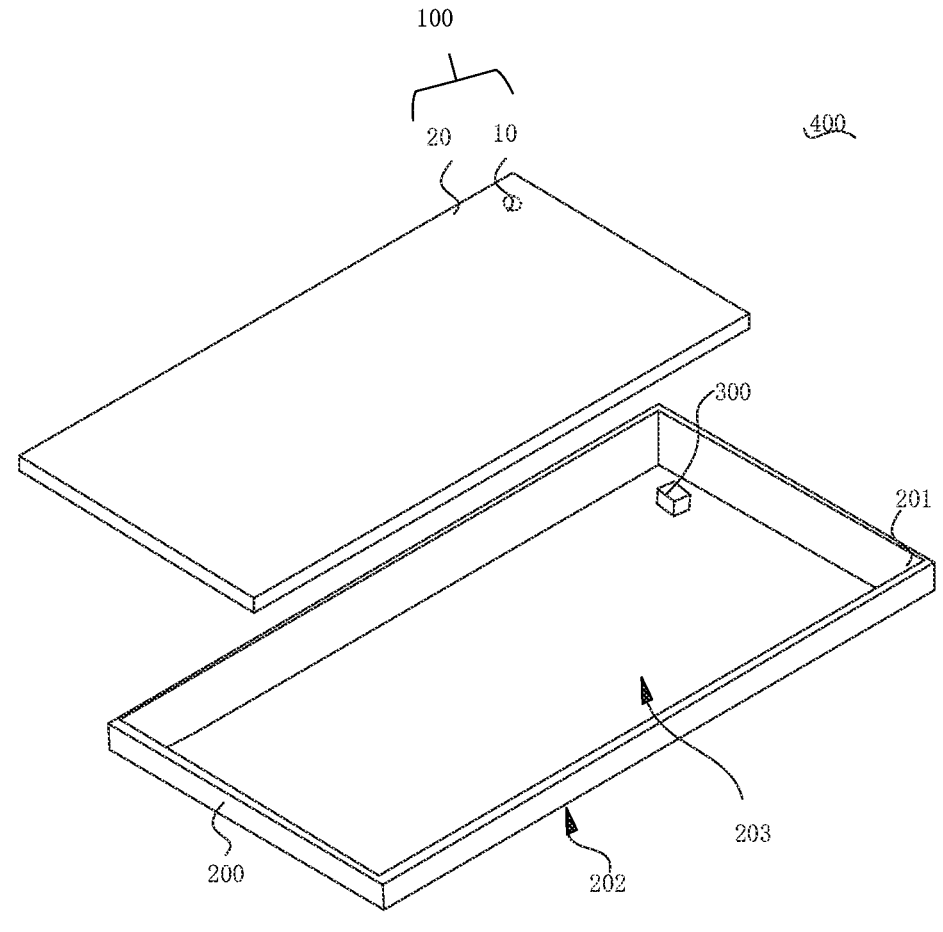
FIG. 15 is an exploded schematic view of a part of a structure of the electronic device according to some embodiments of the present disclosure.

Specifically, as shown in FIG. 15, the housing 200 includes a first surface 201 and a second surface 202 arranged facing away from the first surface 201. The display screen 100 is arranged on the first surface 201 of the housing 200, and an accommodating space is defined by the housing 200 and the display screen 100. The electronic device 400 further includes at least one functional module 300. The functional module 300 is arranged in the accommodating space defined by the housing 200 and the display screen 100, and corresponds to the first display region 10, such that the external signal may pass through the first display region 10 to arrive at the functional module 300. It should be noted that, the functional module 300 may be at least one of a camera, a structural light depth camera module, a time-of-flight depth camera module, a light sensor, a color temperature sensor, a proximity sensor, or a flash light.

In the description of the present specification, the description with reference to the terms "one embodiment", "some embodiments", "illustrative embodiment", "example", "specific example", or "some examples", and the like, means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples.

The terms such as "first", "second", and the like, are used herein for purposes of description, and are not intended to indicate or imply relative importance or significance or to imply the number of indicated technical features. Thus, the feature defined with "first", "second", and the like may include one or more of such a feature. In the description of the present disclosure, it should be noted that, "a plurality of" means two or more, unless specified otherwise.

The above is only some embodiments of the present disclosure and is not intended to limit the scope of the present disclosure. Any equivalent structure or equivalent process transformation using the specification and the accompanying drawings of the present disclosure, or direct or indirect application in other related technical fields, is included in the scope of the present disclosure.

What is claimed is:

1. A display screen, comprising:
   a first display region, comprising a plurality of minimum repeat regions; and
   a second display region, adjacent to the first display region;
   wherein a pixel density of the first display region is less than a pixel density of the second display region, each of the plurality of minimum repeat regions comprises at least two pixel units, each of the at least two pixel units comprises a plurality of pixels having different light-emitting colors, and the pixel units in a same minimum repeat region are all located in a same diagonal direction of the minimum repeat region;
   wherein pixels having a same color emit lights simultaneously in the same minimum repeat region;
   wherein pixels having a same color in the same minimum repeat region are controlled by a same circuit.

2. The display screen according to claim 1, wherein the plurality of minimum repeat regions are arranged in an array, each of the pixel units comprises a pixel having a first color, a pixel having a second color, and a pixel having a third color, and the first color, the second color, and the third color are configured to synthetically display a white light.

3. The display screen according to claim 2, wherein each of the pixel units comprises a first sub-pixel unit and a second sub-pixel unit, the first sub-pixel unit is located in a first column, the second sub-pixel unit is located in a second column, and the first column is different from the second column.

4. The display screen according to claim 3, wherein the first sub-pixel unit comprises the pixel having the first color, the second sub-pixel unit comprises the pixel having the second color and the pixel having the third color, and the pixel having the second color and the pixel having the third color are located in a same column.

5. The display screen according to claim 2, wherein each of the pixel units comprises a first sub-pixel unit, a second sub-pixel unit, and a third sub-pixel unit, the first sub-pixel unit is located in a first column, the second sub-pixel unit is located in a second column, the third sub-pixel unit is located in a third column, and the first column, the second column, and the third column are different from each other.

6. The display screen according to claim 5, wherein the first sub-pixel unit comprises the pixel having the first color, the second sub-pixel unit comprises the pixel having the second color, and the third sub-pixel unit comprises the pixel having the third color.

7. The display screen according to claim 2, wherein each of the plurality of pixels comprises a light-emitting window layer, and light-emitting window layers of the pixels having different light-emitting colors have same opening areas; or
   the light-emitting window layers of the pixels having the different light-emitting colors have different opening areas, and a sum of an opening area of the light-emitting window layer of the pixel having the first color and an opening area of the light-emitting window layer of the pixel having the third color is twice of an opening area of the light-emitting window layer of the pixel having the second color.

8. The display screen according to claim 7, wherein the light-emitting window layers of all of the pixels are in a same plane.

9. The display screen according to claim 1, wherein the first display region is fully enclosed by the second display region; or the first display region is semi-enclosed by the second display region.

10. The display screen according to claim 1, wherein the first display region comprises at least one first adjacent row adjacent to the second display region, and at least one first adjacent column adjacent to the second display region; the second display region comprises at least one second adjacent row adjacent to the first display region, and at least one second adjacent column adjacent to the first display region; the at least one second adjacent row corresponds to the at least one first adjacent row, and the at least one second adjacent column corresponds to the at least one first adjacent column;

wherein a color of a pixel in each first adjacent row is different from a color of an opposite pixel in a corresponding second adjacent row; and/or wherein a color of a pixel in each first adjacent column is different from a color of an opposite pixel in a corresponding second adjacent column.

11. The display screen according to claim 2, wherein the array extends along a row direction and extends along a column direction, wherein the at least two pixel units in the minimum repeat region have different arrangements in a terminating row; and/or the at least two pixel units in the minimum repeat region have different arrangements in a terminating column.

12. The display screen according to claim 11, wherein adjacent sub-pixel units of the at least two pixel units are the same in the same minimum repeat region in the termination row; and/or adjacent sub-pixel units of the at least two pixel units are the same in the same minimum repeat region in the termination column.

13. The display screen according to claim 1, wherein at least one of the first display region and the second display region further comprises a transition region, the first display region has a first brightness, the second display region has a second brightness, the second brightness is less than the first brightness, and a brightness of the transition region gradually decreases in a direction from the first display region to the second display region.

14. The display screen according to claim 13, wherein brightness of pixels in adjacent rows or brightness of pixels in adjacent columns of the transition region is in an arithmetic progression or in a geometric sequence.

15. The display screen according to claim 13, wherein the transition region comprises a column transition region formed by the first display region and the second display region extending in a column direction and a row transition region formed by the first display region and the second display region extending in a row direction;

wherein brightness of pixels of each column in the column transition region is related to the first brightness, the second brightness, a width of the column transition region, and a position of a current column in the column transition region; and/or brightness of pixels of each row in the row transition region is related to the first brightness, the second brightness, a width of the row transition region, and a position of the current row in the row transition region.

16. The display screen according to claim 1, wherein light-emitting window layers of the pixels having the same color are connected in the same minimum repeat region.

* * * * *